United States Patent
Morancho et al.

(10) Patent No.: US 9,831,331 B2
(45) Date of Patent: Nov. 28, 2017

(54) HETEROJUNCTION-BASED HEMT TRANSISTOR

(71) Applicants: CENTRE NATIONAL DE LA RECHERCHE SCIENTIFIQUE—CNRS—, Paris (FR); UNIVERSITE LIBANAISE, Beirut (LB)

(72) Inventors: Frédéric Morancho, Ramonville-Saint-Agne (FR); Saleem Hamady, Toulouse (FR); Bilal Beydoun, Beirut (LB)

(73) Assignees: CENTRE NATIONAL DE LA RECHERCHE SCIENTIFIQUE—CNRS, Paris (FR); UNIVERSITE LIBANAISE, Beirut (LB)

( * ) Notice: Subject to any disclaimer, the term of this patent is extended or adjusted under 35 U.S.C. 154(b) by 0 days.

(21) Appl. No.: 15/028,671

(22) PCT Filed: Oct. 10, 2014

(86) PCT No.: PCT/FR2014/052587
§ 371 (c)(1),
(2) Date: Apr. 11, 2016

(87) PCT Pub. No.: WO2015/052456
PCT Pub. Date: Apr. 16, 2015

(65) Prior Publication Data
US 2016/0254377 A1 Sep. 1, 2016

(30) Foreign Application Priority Data
Oct. 11, 2013 (FR) ...................... 13 59925

(51) Int. Cl.
*H01L 29/66* (2006.01)
*H01L 21/338* (2006.01)
(Continued)

(52) U.S. Cl.
CPC ...... *H01L 29/7787* (2013.01); *H01L 29/1029* (2013.01); *H01L 29/2003* (2013.01); *H01L 29/66431* (2013.01); *H01L 29/7783* (2013.01)

(58) Field of Classification Search
CPC .................. H01L 29/7783; H01L 29/66431
(Continued)

(56) References Cited

U.S. PATENT DOCUMENTS 7,687,799 B2 * 3/2010 Hudait .................. B82Y 10/00
257/14
2007/0278518 A1 12/2007 Chen et al.
(Continued)

FOREIGN PATENT DOCUMENTS

EP 2346071 A1 7/2011
EP 2736079 A2 5/2014

OTHER PUBLICATIONS

C. Hongwei et al.: "Enhanced device performance of AlGaN/GaN HEMTs using thermal oxidation of electron-beam deposited aluminum for gate oxide." 9th International Conference on Solid-State and Integrated-Circuit Technology, 2008, pp. 1443-1446, DOI: 10.1109/ICSICT.2008.4734825; IEEE Conference Publications.
(Continued)

*Primary Examiner* — Calvin Lee
(74) *Attorney, Agent, or Firm* — Volpe and Koenig, P.C.

(57) ABSTRACT

A heterojunction structure of semiconductor material, for a high electron mobility transistor includes a substrate, a buffer layer, arranged on the substrate, of a large bandgap semiconductor material, based on a nitride from column III, where the buffer layer is not intentionally doped with n-type
(Continued)

carriers, a barrier layer arranged above the buffer layer, of a large bandgap semiconductor material based on a nitride from column III, where the width of the bandgap of the barrier layer is less than the width of the bandgap of the buffer layer. The heterojunction structure additionally comprises an intentionally doped area, of a material based on a nitride from column III identical to the material of the buffer layer, in a plane parallel to the plane of the substrate and a predefined thickness along a direction orthogonal to the plane of the substrate, where the area is comprised in the buffer layer.

12 Claims, 6 Drawing Sheets

(51) Int. Cl.
*H01L 29/778* (2006.01)
*H01L 29/10* (2006.01)
*H01L 29/20* (2006.01)

(58) Field of Classification Search
USPC .......................... 257/188–194; 438/174, 175
See application file for complete search history.

(56) References Cited

U.S. PATENT DOCUMENTS

| | | |
|---|---|---|
| 2013/0256685 A1 | 10/2013 | Ohki |
| 2013/0256754 A1 | 10/2013 | Kamada |
| 2014/0147977 A1 | 5/2014 | Charles et al. |
| 2014/0327012 A1* | 11/2014 | Ougazzaden ....... H01L 21/0237 257/76 |

OTHER PUBLICATIONS

C. Hongwei et al.: "Self-aligned enhancement-mode AlGaN/GaN HEMTs Using 25 keV fluorine Ion implantation." 68th Device Research Conference, 2010, pp. 137-138, DOI: 10.1109/DRC.2010.5551879, IEEE Conference Publications.

\* cited by examiner

HETEROJUNCTION-BASED HEMT TRANSISTOR

TECHNICAL DOMAIN

The present invention generally relates to techniques for implementing high electron-mobility transistors (HEMT transistor) in heterostructures. It more specifically relates to a heterostructure from which one can implement such a transistor.

The invention has applications, in particular in the domain of power electronic components used, for example, in devices for production, conversion and/or management of renewable energies such as wind or solar energy, but also in low ecological-impact transport.

PRIOR ART

Several years ago renewable energy sources such as, for example, wind or solar energy became viable alternative solutions for dealing with depletion of fossil energy resources and global warming. Additionally, the development of low ecological impact means of transportation, such as tramway, train or even electric car, calls for the development of suitable power-electronics components, and more specifically power switches.

In particular, improvements to semiconductor type components in integrated circuit form, like for example power transistors, act on the intrinsic properties of these components in order to increase their usable voltage range and/or their maximum switching frequency. They also aim to propose solutions for full integration allowing mass manufacturing in order to reduce production costs.

At this time, only silicon (Si) based power components such as for example MOS transistors ("Metal Oxide Semi-conductor") or IGBT transistors ("Insulated Gate Bipolar Transistors") perform this type of function. However, the physical properties inherent to the use of Si make the technological evolution of this type of component difficult.

Over several years, many research projects have been able to find alternative solutions by using large bandgap materials with which to implement new power components such as for example high electron-mobility transistors, also called HEMT transistors.

Silicon carbide (SiC) and gallium nitride (GaN) appeared to be 2 of the most promising materials because of a high critical electrical field and a large operating temperature range. Despite the very remarkable results, the SiC based power-components nonetheless face difficulties penetrating the mass markets because of the limited sizes of SiC wafers (currently 100 to 150 mm diameter maximum). Additionally, there currently continue to be problems for this type of component relating to managing defects, but also to reproducibility of manufacturing methods.

GaN seems to be a very attractive alternative to SiC for the design of power components. In fact, GaN is a more effective semiconductor material than Si or SiC in terms of compromise about the ratio on-resistance/voltage withstand capability. This ratio, otherwise called figure of merit, characterizes the static performance of a power switch.

Figure 1:
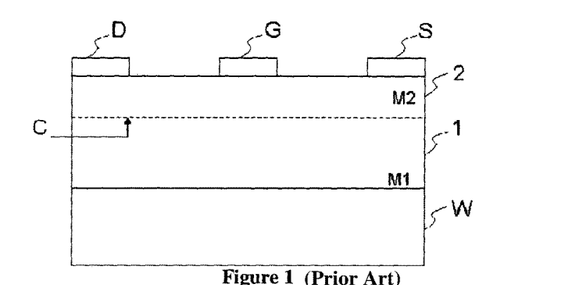
FIG. 1 is a section view of an example of stacking a heterojunction structure from the prior art.

FIG. 1 shows an example of a heterojunction electronic structure used in an HEMT transistor. This heterojunction electronic structure comprises several GaN-based layers each having controlled intrinsic features and stacked one above another, with a substrate W;
above which comes a first layer 1, called buffer layer, composed of a material M1 characterized by the bandgap thereof or "gap" Eg1; and
a $2^{nd}$ layer 2, called barrier layer, coming above the first layer 1 and composed of a material M2 characterized by the bandgap thereof or "gap" Eg2, where Eg1 is less than Eg2

With this type of structure, the formation and circulation of a two-dimensional electron gas, named 2DEG in the jargon of the person skilled in the art, is possible in a channel C formed in the material M1 with smaller gap Eg1 at the interface between the 2 materials M1 and M2 of the heterojunction. With such a structure it is possible to combine a high two-dimensional electron gas density with high carrier mobility in order to obtain HEMT transistors with large drain currents, a necessary condition for applications in power electronics.

Many research projects deal with the management and improvement of the two-dimensional electron gas confinement near the AlGaN/GaN heterojunction by studying various solutions. These solutions can be in the deposition of the GaN layer in order to modify some intrinsic properties of the heterostructure serving in that way to obtain HEMT transistors with relatively high switching speeds and also relatively modest losses. They can also consist of creating new MOS-HEMT type structures.

In that way, for example, a MOS-HEMT transistors structure was proposed in the 2008 IEEE publication *Enhanced device performance of AlGaN/GaN HEMTs using thermal oxidation of electron-beam deposited aluminum for gate oxide*, by C. Hongwei et al. This publication shows the performance improvement of the conventional HEMT transistor's structure which can be obtained by adding an oxidation layer near the gate electrode. The MOS-HEMT structure obtained in that way has smaller leakage currents and a larger drain current range than a conventional HEMT structure with, however, the need to have a threshold voltage below 0 V in order to place the transistor in an off-state.

Now, currently another very significant research direction concerns the resting state of this type of structure, meaning the state of the transistor when no voltage is applied to the gate electrode of the HEMT transistor. In fact, in many power applications, the transistor used as a switch must be in the open state by default (also called "normally-OFF" functionality). In fact, this state is indispensable for safety and energy-saving reasons, like, for example, in car or rail transportation applications.

Several GaN based structures have recently been proposed in order to satisfy the normally-OFF functionality of an HEMT transistor. Work by the team of C. Hongwei et al in a publication *Self-aligned enhancement-mode AlGaN/GaN HEMTs Using 25 keV fluorine Ion implantation* published in 2010 in the IEEE journal has shown the possibility of modifying the threshold voltage in order to obtain a normally-OFF HEMT transistor by using treatment with fluoride ions. In order to do that, a fluorine doped area is inserted in the barrier layer of the AlGaN/GaN structure of the HEMT transistor and it is placed under the gate electrode; the fluorine Ion levels were set to have a sufficient offset of the transistor's Vgs voltage.

The US patent application 2007/0278518 A1, Enhancement Mode III-N Devices and Circuits, additionally proposes another change to the manufacturing method for an HEMT transistor structure using a fluorine plasma based treatment method on the barrier layer of the heterostructure. With this method, the intrinsic features of the heterostructure can be modified with a relatively simple method (use of a fluorine plasma) in order to obtain a normally-OFF transistor.

Advances in design and also manufacturing techniques like those presented above make it possible to obtain normally-OFF HEMT transistors which can address only certain energy conversion markets because of still relatively large leakage currents.

Another way for improvement has been proposed by the MicroGaN. This company in fact sells power structures based on Cascode assemblies combining a GaN based HEMT transistor to take advantage of the high electron mobility with a MOS transistor in Si in order to obtain low leakage currents. Despite fast switching speed and low leakage currents, it is not possible to consider high power applications with this solution because this type of structure is thermally limited by the maximum operating temperature of Si transistors used in the Cascode assembly.

SUMMARY OF THE INVENTION

The invention aims to overcome the aforementioned disadvantages of the prior art, and more specifically aims to allow the implementation of an HEMT transistor with a small leakage current at the gate, a high switching speed and a threshold voltage greater than 0 V in order to provide the normally-OFF functionality.

For this purpose, a first aspect of the invention proposes a heterojunction structure, also called heterostructure, of semiconductor material, in particular for a high electron mobility transistor (HEMT). The structure comprises:
- a plane substrate;
- a buffer layer, arranged on the substrate, of a large bandgap semiconductor material, based on a nitride from column III, where said buffer layer is not intentionally doped with n-type carriers;
- a barrier layer arranged above the buffer layer, of a large bandgap semiconductor material based on a nitride from column III, where said width of the bandgap of the barrier layer is less than the width of the bandgap, Eg1, of the buffer layer;
- an intentionally doped area, of a material based on a nitride from column III identical to the material of the buffer layer, with a predefined length and width in a plane parallel to the plane of the substrate and a predefined thickness along a direction orthogonal to the plane of the substrate, where said intentionally doped area is comprised in the buffer layer.

According to embodiments of the invention, the intentionally doped area is placed under the interface between the buffer layer and the barrier layer at a preset, non-zero distance from this interface along the direction orthogonal to the plane of the substrate.

This intentionally doped area located in the buffer layer serves to locally increase the gap between the Fermi level and the conduction band of the heterojunction, meaning at the interface between the buffer layer and barrier layer materials. In fact, the effect of the presence of the intentionally doped area is to raise the conduction band of the interface above the Fermi level, meaning the highest energy level occupied by electrons, serving in that way to offset the threshold voltage of this heterostructure and in that way to obtain a normally-OFF transistor.

According to different embodiments of the invention, the buffer layer, the barrier layer and the intentionally doped area are formed of a semiconductor material based on a nitride from column III such as, for example, GaN.

A p-type dopant can be used in order to intentionally dope this area. The difference in internal stress between the substrate and the buffer layer can cause tears of the GaN film. Advantageously, in order to remedy this problem but also potential problems of dislocation, in an embodiment of the invention, a nucleation layer is interposed between the substrate and the buffer layer.

A $2^{nd}$ aspect of the invention relates to an HEMT type transistor implemented from a heterostructure such as described above. The transistor comprises source S, drain D and gate G electrodes which can be arranged on the barrier layer.

In some embodiments, such a transistor can have an insulating layer, for example oxide-based, deposited on a barrier layer with the gate G electrodes deposited on the insulating layer and the drain D and source S electrodes deposited on the barrier layer on either side of the gate in the upper plane of the barrier layer.

For example, the oxide-based insulating layer can be deposited only on the gate G electrode, where said insulating layer has for example an identical surface to the surface of the gate G electrode.

In some embodiments, the threshold voltage of the transistor can be adjusted because of at least one of the following features, taken in isolation or in combination:
- The surface of the intentionally doped area can be modified in its plane parallel to the plane of the substrate, and, in particular, in an example, the extent to which it is below or equal to the surface of the gate electrode in said plane.
- The distance d between the intentionally doped area and the interface between the buffer layer and the barrier layer along the direction orthogonal to the plane of the substrate can be modified; in an example, this distance d is less than 800 nm.

According to a $3^{rd}$ aspect of the invention, a manufacturing method for such a heterostructure is proposed which comprises:
- The preparation of a plane substrate;
- The deposition on the substrate of a first buffer layer of a large bandgap semiconductor material, based on a nitride from column III, where said buffer layer is not intentionally doped with n-type carriers;
- The formation, above the first buffer layer, of an area having a predefined length and width in a plane parallel to the plane substrate, of a material based on a nitride from column III identical to the material of the first buffer layer and intentionally doped by p-type doping elements;
- The deposition of a $2^{nd}$ buffer layer of a material based on a nitride from column III identical to the material from the first buffer layer, where said buffer layer is not-intentionally doped with n-type carriers and covers the first buffer layer and also the intentionally doped area.
- The deposition, above the $2^{nd}$ buffer layer, of a barrier layer of a semiconductor material with a large bandgap based on a nitride from column III having a bandgap less than the bandgap of the material from the first buffer layer and the $2^{nd}$ buffer layer.

Advantageously, this manufacturing method is simple and needs only very few additional steps compared to the manufacturing of a conventional heterostructure, for example for the implementation of a conventional HEMT transistor.

In some embodiments, the manufacturing process of the heterojunction structure can be optimized because of one or more of the following manufacturing steps, taken separately or in combination:

- The intentionally doped area can be fabricated by a "lift" doping process;
- The intentionally doped area can be fabricated by a doping/etching process;
- The thickness of the $2^{nd}$ buffer layer can be controlled so that is less than or equal to 400 nm;
- A step of growing at least one nucleation layer can be performed before the step of depositing the first buffer layer;
- A high electron mobility transistor (HEMT) can be fabricated, comprising steps of manufacturing of gate, drain and source electrodes deposited on the barrier layer;
- The intentionally doped area can be positioned on the gate electrode;
- The surface of the intentionally doped area in a plane parallel to the plane of the substrate can be controlled in such a manner that is below or equal to the surface of the gate electrode in a plane parallel to the substrate.

According to a $4^{th}$ aspect, the invention relates to a semiconductor product comprising at least one transistor according to the $2^{nd}$ aspect. It can for example involve a power switch or any other power components such as a power voltage regulator, for example.

BRIEF DESCRIPTION OF THE DRAWINGS

Other features and advantages of the invention will again appear upon reading the following description. This is purely illustrative and must be read in light of the attached drawings in which.

DETAILED DESCRIPTION OF THE EMBODIMENTS

It should be explicitly stated that all figures showing section views of the heterojunction structure and all figures showing stacks of layers and also those showing manufacturing process steps for the heterojunction structure and the HEMT transistor are not to scale. The various thicknesses are not shown in proportions conforming to reality. In the interest of simplification, in the following description and in the figures, the elements common to all the structures bear the same references.

The invention will be more specifically described in a nonlimiting example of application to a heterojunction structure for HEMT transistors. The heterojunction structure example described below is based on nitrides of elements from column III of the periodic table of the elements, also called Mendeleev table; more specifically, the example covers a heterojunction structure based on AlGaN/GaN nitride materials. GaN can be the semiconductor material from which the buffer layer 1 is made with a bandgap, Eg1, smaller than the bandgap, Eg2, of AlGaN which can be the material from which the barrier layer 2 is made. Just the same it is of course obvious that the invention is not limited to these examples. For example, a heterojunction structure which uses the properties of another type of material with which to create an interface between a large gap material of GaAlAs type and a small gap material of the GaAs type can also be implemented.

According to some embodiments, the structure comprises an intentionally doped area 3 located in the buffer layer 1, under the interface between the buffer layer and the barrier layer.

Figure 2:
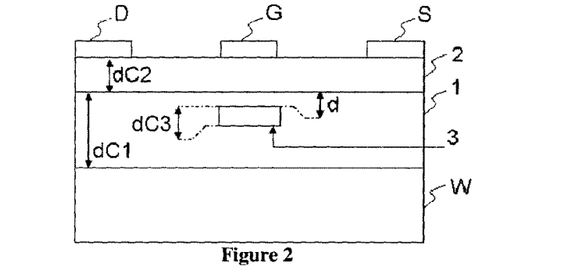
FIG. 2 is a section view of an example of a stack of a heterojunction structure according to an embodiment of the invention.

FIG. 2 shows a first example of stacking the layers constituting the heterojunction structure. In increasing order of stacking, it includes:
- a plane substrate W;
- a buffer layer 1, arranged on the substrate W, of a large bandgap, Eg1, semiconductor material, based on a nitride from column III, where said buffer layer is not intentionally doped with n-type carriers;
- a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
- an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of said substrate, where said intentionally doped area 3 is arranged in the buffer layer 1.

The presence of the intentionally doped area in the buffer layer 1 raises the conduction band of the interface between the buffer layer 1 and the barrier layer 2 above the Fermi level, meaning the highest energy level occupied by electrons, serving in that way to offset the threshold voltage of the transistor implemented with this heterostructure and in that way to obtain a normally-OFF transistor.

In an implementation example, the manufacturing process of such a heterostructure includes:

The preparation of a substrate W;

The deposition on the substrate W of a buffer layer 1 of a large bandgap, Eg1, semiconductor material, based on a nitride from column III, where said buffer layer 1 is not intentionally doped with n-type carriers;

The deposition on the buffer layer 1 of a barrier layer 2, of a large bandgap, Eg2, semiconductor based on a nitride from column III;

The intentional doping of an area 3, of material based on a nitride from column III identical to the material of the buffer layer 1, of a length Lo3 and width La3 and a predefined thickness dC3 in a plane parallel to the plane of the substrate W and along a direction orthogonal to the plane of the substrate, where said area is comprised in the buffer layer 1.

The performance of the heterojunction structure with such an intentionally doped area 3 depends among other things on the crystalline quality of the epitaxial material used.

GaN is an epitaxial material which serves to limit the partial lattice mismatches with the materials forming the heterostructure and which are obtained by crystallographic growth from the substrate W.

Several types of substrate materials can be used in order to make the substrate W, as an epitaxial substrate for GaN. In these embodiments, silicon carbide (SiC), for example, is used which gives a lattice mismatch of order 3.4%, or sapphire ($Al_2O_3$). Other examples of substrates, such as for example GaAs or ZnO based substrates or else substrates called "free standing", can also be used.

As a variant, silicon (Si) can also be used to implement the substrate. Si is a material which can be used for the manufacturing of components in general and HEMT transistors in particular, whose intrinsic properties are very well-managed, despite a lattice mismatch greater than SiC and poorer performance in particular as it relates to thermal conduction. In fact, the massive use of silicon wafers of very high manufacturing quality and large diameter (for example 6 or 8 inches) serves to reduce the production costs and also the prices of such components.

Depending on the nature of the substrate, for example SiC or Si, or crystalline orientation of the Si substrate, the quality of the GaN layer obtained by epitaxial growth can vary, which could change the performance of the heterojunction structure. This is why, in an implementation example, the heterojunction structure can be made on an Si substrate of predefined crystalline orientation, for example the orientation notated (111) in the literature, with interposition if necessary of transition layers (more commonly called nucleation layers) in order to remedy possible problems from mismatch but also from tearing of the film which is due to the different internal mechanical stresses between the 2 layers (of Si and of GaN). These nucleation layers can be deposited by epitaxy, for example on several successive deposition operations, on another layer of nitrite compounds. In this way, a growth of the buffer layer 1 of desired quality can be obtained at the interface with barrier layer 2. It will also be noted that the Si substrate can have a (001) or even (100) crystalline orientation and that if necessary intermediate layers can be used, as previously disclosed, in order to obtain a GaN film matching the specifications for the application.

The substrates described above are cited here solely as examples and are in no way limiting on the invention.

Figure 3:
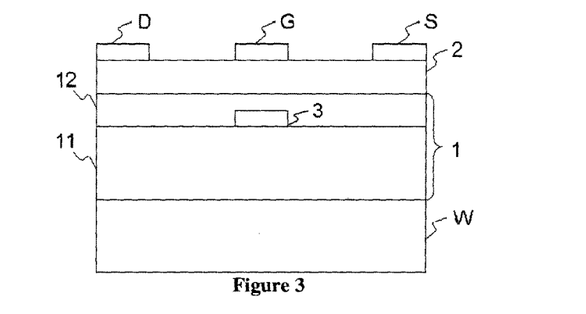
FIG. 3 is a detailed section view of the various layers constituting a heterojunction structure according to an embodiment of the invention.

In an embodiment shown in FIG. 3, the buffer layer 1 can be composed of a nitride based material, for example GaN. It can comprise at least one first buffer layer 11 which can be deposited on one or more nucleation layers as previously indicated. The buffer layer 11 serves as a base for growth of a $2^{nd}$ buffer layer 12 of the buffer layer 1. A $2^{nd}$ layer, called barrier layer 2 and GaN based, is next obtained. Preferably, it is made such that the buffer layer 12 and also the layer 2 have excellent crystalline properties because these layers participate in the creation of a two-dimensional electron gas.

Other nucleation and/or passivation layers can be provided between the substrate W and the buffer layer 11 and/or between the buffer layer 11 and the buffer layer 12, but are not shown in FIG. 3. The growth of such layers can be done by using microelectronic techniques, like for example the Vapor Phase Epitaxy technique in HVPE type reactors (Hybrid Vapor Phase Epitaxy), from certain gas mixtures of, for example, GaCl3/NH3 type. Because of fast growth rates, this technique serves to obtain relatively large thicknesses and excellent qualities. Other deposition techniques can also be used such as, for example, the MBE (Molecular Beam Epitaxy) process, but also the MOCVD (Metal-Organic Chemical Vapor Deposition) process. These processes are cited for examples and are in no way limiting on the design techniques for such nitride layers which can be used for the design of HEMT transistors.

In some embodiments, the growth of the buffer layer 11 can be obtained by the MOCVD process deposition, for example by using elements from column III, in particular by routing them in a reaction chamber. For example, it can involve a mixture of molecular hydrogen and a chemical precursor. GaN in that way forms on the surface of the substrate W in order to form in the reaction chamber the first part of the of not intentionally n-doped barrier layer 1 (named buffer layer 11). This layer is intrinsic because it is not intentionally doped; It can be called, interchangeably, GaN-NID (GaN, Not Intentionally Doped), UID-GaN (Unintentionally Doped GaN) or i-GaN (intrinsic GaN). The intrinsic doping of such a layer is naturally n-type and has a carrier (i.e. electron) concentration per cubic centimeter which is of order $10^{16}$ $cm^{-3}$. It is activated, for example, under an RF plasma and, for example, at a speed of order a few microns per hour. The thickness of the buffer layer 11 can then be as small as of order 1 to 3 μm.

In some embodiments, the heterojunction structure additionally includes an intentionally doped area 3, with p-type doping for example. The material for this intentionally doped area 3, located in the buffer layer 1, is of the same kind as that of the buffer layer 1.

The dimensions of the intentionally doped area 3 and also the thickness dC3 thereof play an important role in the properties of the heterostructure; it is preferable to precisely limit the implantation area. The formation of the intentionally doped area 3 on the buffer layer 11 can be done for example according to one of 2 known technological processes which are a "lift" doping process and a doping/etching process.

Figure 4A:
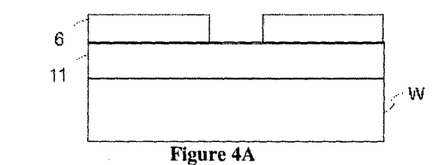
FIGS. 4A to 4C are section views showing the main technological steps for implementing the "lift" doping process.
Figure 4B:
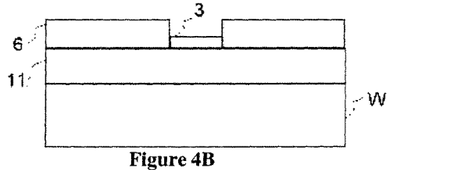
Figure 4C:
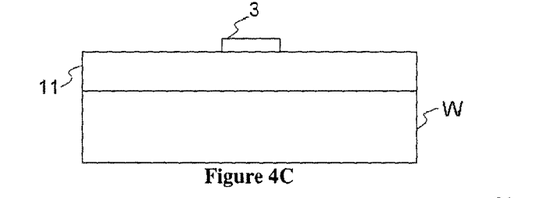

FIGS. 4A to 4C show the main technological steps for implementation of the "lift" doping process which can be used in some embodiments for intentionally doping the intentionally doped area 3.

In the first place, a mask or protection layer 6 with which to precisely delimit the intentionally doped area 3 is implemented on the buffer layer 11 (FIG. 4A). This mask 6 can be made for example with a photosensitive polymer allowing the use of conventional photolithographic techniques for delimiting the intentionally doped area 3 on the buffer layer 11. Once the area is delimited, the process for growing the layer by epitaxy, which was previously described, can be implemented with the insertion of a p-type doping element, like magnesium (Mg) for example, in this process of growing the intentionally doped area 3. The levels of the doping elements are selected in order to get a p-type doped area corresponding to the specifications for the application (FIG. 4B). An example showing the type and quantity of doping elements used for the implementation of an HEMT transistor will be presented later in the description. Once the growth of the intentionally doped area 3 is finished, the mask 6 is removed, for example with the help of a process using a remover or any other wet or dry etching process serving to eliminate this layer 6 without altering the buffer layers 11 and 3. FIG. 4C shows the intentionally doped area 3 at the end of this technological process.

Figure 5A:
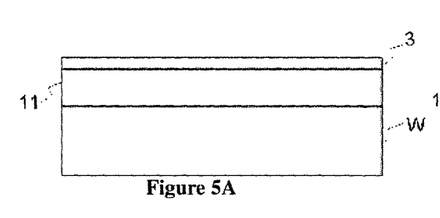
FIGS. 5A to 5D are section views showing the main technological steps for implementing the doping/etching process in the intentionally doped area.
Figure 5B:
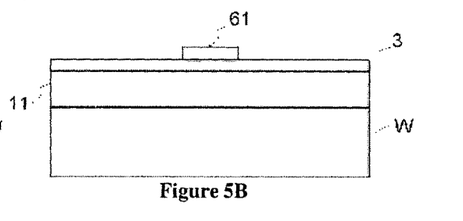
Figure 5C:
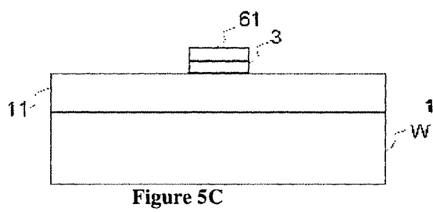
Figure 5D:
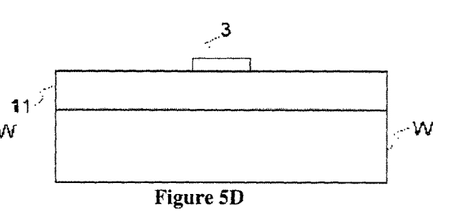

Another manufacturing method for the intentionally doped area 3 can use a technological process called doping/etching process. To do this, as shown in FIG. 5A, the intentionally doped area 3 is deposited on the entirety of the structure using for example the same growth process as previously cited in the Lift doping process. Once the deposit is done, a masking layer 61 can be deposited using a photosensitive polymer material, for example (FIG. 5B). The unwanted areas are next eliminated (FIG. 5C) by a dry etching for example using for example a DRIE process (Deep Reactive Ion Etching) with which in that way to delimit only the intentionally doped area 3 in the area under the mask 61. Once the etching is finished, the masking layer 61 is eliminated using techniques like those previously cited and known per se to the person skilled in the microelectronic arts (FIG. 5D).

It will be noted that some materials that can be used in order to create the protective layer 6 and/or 61 have been given above only as examples as has the doping method for the intentionally doped area 3. Additionally, it is well understood that the entirety of the various steps of the technological process such as, for example, photosensitive resin deposition phases, photolithographic steps and cleaning steps necessary to such a process have not been cited so as to not encumber the description.

The $2^{nd}$ buffer layer 12 making up the buffer layer 1 can next be deposited according, for example, to the same growth method as the buffer layer 11. The thickness of the buffer layer 12 will for example be smaller by a ratio of 10 relative to the buffer layer 11 serving in that way to bring the intentionally doped area 3 of the transistor conduction channel closer.

The material making up the barrier layer 2 can be formed of a semiconductor material having a bandgap, Eg2, larger than the bandgap, Eg1. In the example considered here, this layer can be composed of AlGaN, such as $AlGa_{(1-x)}N$, where x is the molar fraction and is included between 0 and 1, where the thickness of the barrier layer 2 less than 1 μm.

In an embodiment not shown in the Figures, the barrier layer 2 can be composed of several layers with respective managed features, such as, for example, a doped layer, called donor layer supplying electrons participating in the formation of the two-dimensional electron gas.

The heterojunction structure which was presented above allows an improvement, for example, in the control of threshold voltages of the HEMT transistors in order to obtain normally-OFF transistors.

Figure 6:
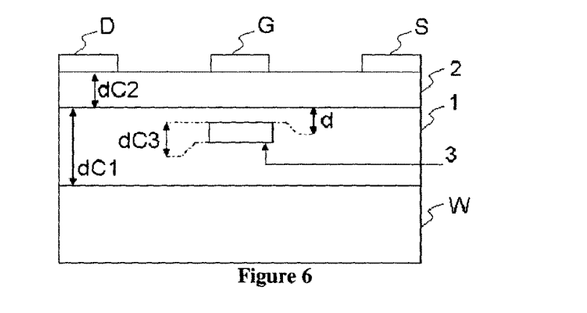
FIG. 6 is a section view of an example of a stack of an HEMT transistor according to an embodiment of the invention.

In an example of implementation of an HEMT transistor, it comprises, as shown in FIG. 6:
a plane substrate W,
a buffer layer 1, arranged on the substrate W, of a large bandgap, Eg1, semiconductor material, based on a nitride from column III, where said buffer layer is not intentionally doped (i-GaN) with n-type carriers;
a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
source (S), drain (D) and gate (G) electrodes.

In an implementation example, the manufacturing process of a (HEMT) transistor using such a heterostructure includes:
The preparation of a substrate W;
The deposition on the substrate W of a buffer layer 1 of a large bandgap, Eg1, semiconductor material, based on a nitride from column III, where said buffer layer is not intentionally doped (i-GaN) with n-type carriers;
The deposition on the buffer layer 1 of a barrier layer 2, of a large bandgap, Eg2, semiconductor based on a nitride from column III;
The intentional doping of an area 3, of material based on a nitride from column III identical to the material of the buffer layer 1, of a predefined length Lo3 and width La3 and a predefined thickness dC3 in a plane parallel to the plane of the substrate W and a predefined thickness along a direction orthogonal to the plane of the substrate, where said area is comprised in the buffer layer 1.
The creation of gate (G), drain (D) and source (S) electrodes using one or several layers of electrically conducting materials.

It should be noted that all the intermediate steps related to such a process, which are the steps of photolithography, cleaning and also for example the steps of depositing photosensitive resin, are not described in detail here in order to not overburden the present description.

In an example of implementation of the invention, a p-type dopant from column II-A, such as for example magnesium (Mg), can be used in order to dope the material from the intentionally doped area 3. However other dopants from this same column of the periodic table can also be used, like for example beryllium. The Drain D and Source S electrodes are contacts called "ohmic" in that way making low resistance metal/semiconductor contacts and the Gate G electrode is a metal/semiconductor contact called Schottky. Since the manufacturing process for such electrodes is known to the person skilled in the art, it will not be detailed in the description.

The metals used to make these contact pads for the HEMT transistor described in the invention can be of various kinds depending on the desired properties of the contacts.

The electrodes can be composed of a single metal layer, for example Ti, Al or other metals, or even a metal bilayer or trilayer.

These metals can be deposited by traditional methods for depositing metals used in microelectronics such as for example the Lift-off method or the LIGA (Lithographie, Galvanoformung and Abformung, a German term meaning lithography, electroplating and molding) method. Said electrodes can also be made of other materials whose electrical properties will have been previously modified in order to be suited to the desired contact resistance.

As it was already presented in the preceding, the invention serves to obtain an HEMT transistor with a zero or positive threshold voltage in order to obtain a normally-OFF HEMT transistor. In order to do this, in an example of implementation of the process, an intentionally doped area 3 is created, for example doped with p-type elements, and a barrier layer 1; said intentionally doped area 3 is placed under the gate electrode (G) of the transistor and varies in size, thickness, depth and quantity of dopants according to the embodiments. With these parameters, the threshold voltage of the HEMT transistor can be controlled.

In order to not deplete the conduction channel in a region not controlled by the gate, the intentionally doped area 3 characterized by the length Lo3 thereof and width La3 thereof in a plane parallel to that of the substrate preferably has sizes less than or equal to the sizes of the gate G electrode in a plane parallel to the plane substrate.

Figure 7:
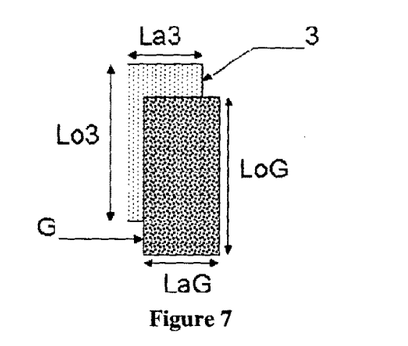
FIGS. 7 to 9 are views along various axes of the placement of the gate (G) electrode of the transistor relative to the doped layer.

Referring to FIG. 7, the following relationships then apply:

$$Lo3 \leq LoG, \quad (1)$$

$$La3 \leq LaG. \quad (2)$$

where:
Lo3 is the length of the intentionally doped area 3;
La3 is the width of the intentionally doped area 3;
LoG is the length of the gate (G) electrode; and
LaG is the width of the gate (G) electrode.

Figure 8:
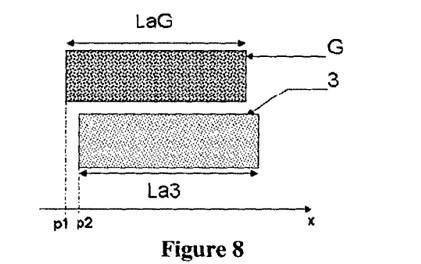
Figure 9:
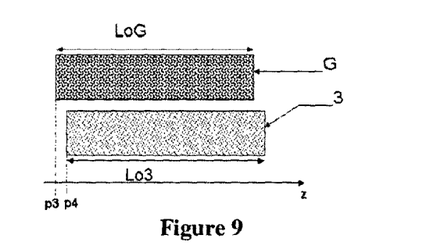

These dimensions are taken in a plane parallel to the plane of the substrate Additionally, in order to not incur a blockage of the gate current, the placement of the intentionally doped layer 3 relative to the gate G electrode is important. To do this, the placement of the intentionally doped area 3 relative to the gate G electrode must be (FIG. 8 and FIG. 9):

$$[B1=0; B2=0]_{LoZCP=LoG; LaZCP=LaG}, \quad (3)$$

where:

$$[B1 \leq 0; B2 \leq 0]_{LoZCP=LoG; LaZCP=LaG}. \quad (4)$$

With:

$$B1 = p1 - p2, \quad (5)$$

$$B2 = p3 - p4. \quad (6)$$

where:
p1 is the positioning of the gate (G) electrode on the x-axis;
p2 is the positioning of the intentionally doped area 3 on the x-axis;
p3 is the positioning of the gate (G) electrode on the z-axis;
p4 is the positioning of the intentionally doped area 3 on the z-axis;
B1 is the separation between the gate (G) electrode and the intentionally doped area 3 along the x-axis;
B2 is the separation between the gate (G) electrode and the intentionally doped area 3 along the z-axis;
Lo3 is the length of the intentionally doped area 3;
La3 is the width of the intentionally doped area 3;
LoG is the length of the gate (G) electrode; and
LaG is the width of the gate (G) electrode.

The presence of the intentionally doped area 3 composed of p-doped GaN in the i-GaN buffer layer 1, serves to increase the Fermi level difference and, in that way, the conduction band of the AlGaN/i-GaN heterojunction. The maximum threshold value obtained in that way can be achieved with a doping concentration of order $1 \times 10^{+19}$ cm$^{-3}$ with a p-type dopant such as magnesium (Mg), for example.

Figure 10:
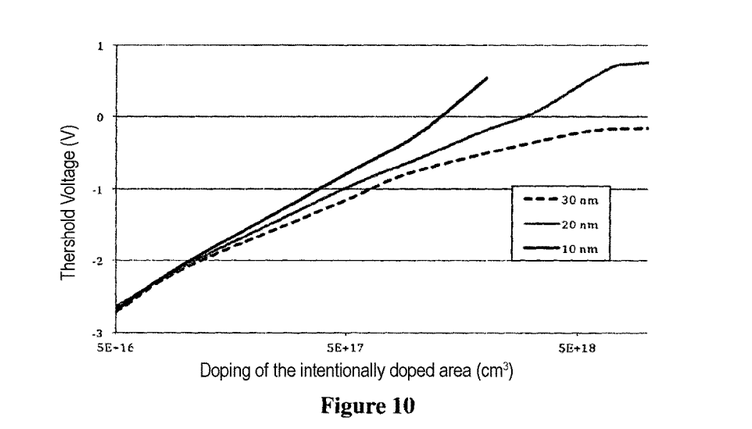
FIG. 10 is a graph showing the variation of the HEMT transistor's threshold voltage as a function of the doping of the doped layer.

The graph in FIG. 10 shows the results obtained by modeling of such a structure with various values of threshold voltage (V) of an HEMT transistor for various doping values (cm$^{-3}$) according to an example of implementation of the invention. It should be noted that these simulations are given for predefined doped-area dimensions with a thickness of the intentionally doped area 3 equal to 400 nm, a width of 1 μm and also for distances d of 10 nm, 20 nm and 30 nm. The results on this graph point out the influence of the doping on the value of the threshold voltage of the HEMT transistor from the invention and more particularly it is shown that the maximum bandgap can be reached by several doping values; in other words, a normally-OFF structure can be obtained with different doping values and small distances d, at least below 30 nm.

However, it should be noted that the increase of the threshold voltage is not only due to the increase of the bandgap affected by the increase of the doping of the intentionally doped area 3, but also the rate of increase of the bandgap inside the intentionally doped area 3. In this way, a desired maximum gap can be obtained more quickly using a higher doping. Additionally, in order to manage the internal noise of the HEMT transistor according to the invention, the difference between the doping of the intentionally doped area 3 and the doping of the not intentionally doped layer 1 surrounding the intentionally doped area 3 must be at least one decade.

According to another example of implementation, the invention proposes to control the threshold voltage of the transistor by varying the distance between the intentionally doped area 3 and the AlGaN/GaN interface. In fact, the gap between the Fermi level and the conduction band, and therefore the threshold voltage of the transistor, can be adjusted by reducing or increasing the distance between the intentionally doped area 3 and the AlGaN/GaN interface area.

Figure 11:
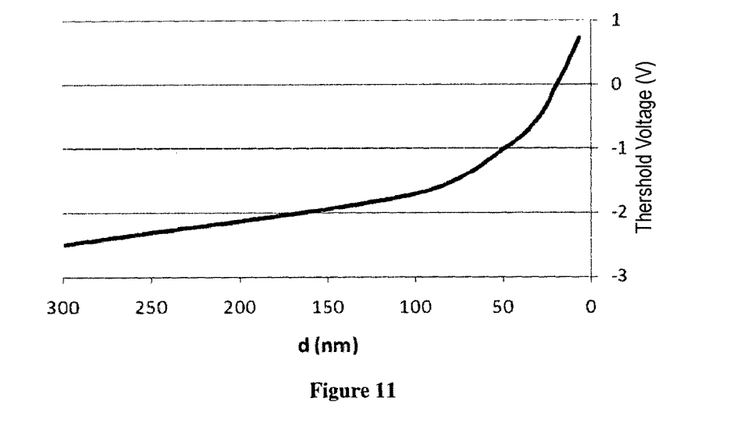
FIG. 11 is a graph showing the variation of the HEMT transistor's threshold voltage as a function of the distance between the doped layer and the AlGaN/GaN interface area.

The graph from FIG. 11 shows the variation of the threshold voltage of the transistor (V) as a function of the distance d (μm) between the intentionally doped area 3 and the AlGaN/GaN interface area.

The simulation results are given for the predefined dimensions of the intentionally doped area 3 with a thickness of the intentionally doped area 3 equal to 100 nm, a width of 1 μm and also a doping of $2 \times 10^{18}$ cm$^{-3}$. This graph shows the increase of the threshold voltage of the HEMT transistor as a function of the reduction of the distance d of the intentionally doped area 3. According to an embodiment, the variation and, more specifically, the increase of the threshold voltage of the HEMT transistor is proportional to the reduction of the distance between the intentionally doped area 3 and the interface area. It should be noted that the values shared are given as examples and are not limiting on the scope of the invention. The doping levels and the dimensions of the intentionally doped area 3 can vary depending on the application domain of the invention and the desired threshold voltage.

Figure 12:
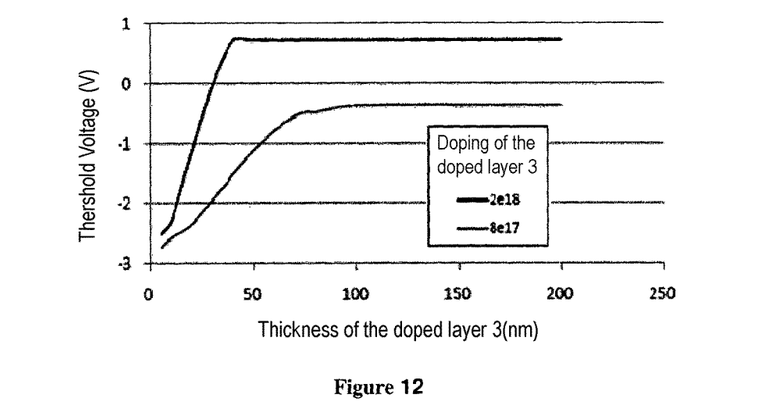
FIG. 12 is a graph showing the variation of the HEMT transistor's threshold voltage as a function of the thickness of the doped layer.

The embodiments of the invention serve to control the threshold voltage of the transistor as a function of the thickness dC3 of the intentionally doped area 3. In fact, as was previously presented, adding the intentionally doped area 3 between the layers of not intentionally doped GaN (i-GaN), serves to increase the gap between the Fermi level and the conduction band in that way serving to control among other things the threshold voltage of the HEMT transistor. When the thickness of the intentionally doped area 3 increases, as shown in FIG. 12, it leads to the increase of the gap between the Fermi level and the conduction band until a threshold value beyond which the influence thereof (the influence of the thickness on the gap) is no longer found. In fact, from a certain sufficiently high thickness and depending on other parameters such as the doping quantity, the surface thereof and the positioning thereof, the gap then becomes constant and equal to that of a not surrounded p-doped region.

Figure 13:
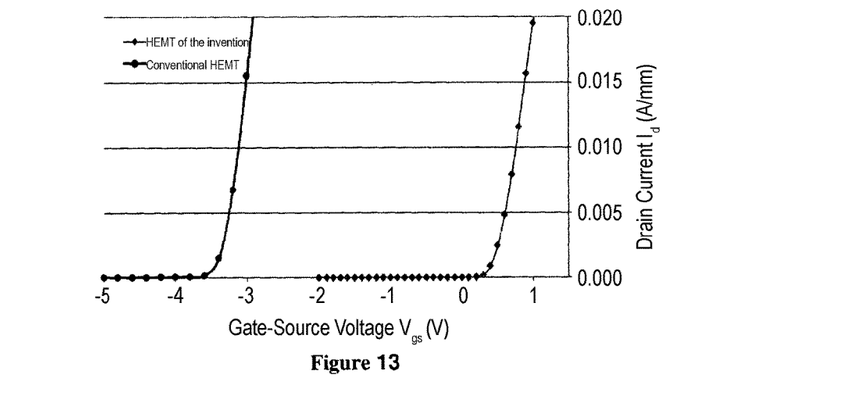
FIG. 13 is a graph showing the transistor's threshold voltage and current according to an embodiment of the invention.

The graph in FIG. 13 compares the threshold voltage of a transistor according to an example of implementation of the invention with the threshold voltage of the conventional normally-ON HEMT having the same physical and geometric parameters except for the intentionally doped area 3. For this structure which is shown as an example, the structure parameters are:
  substrate W of Si(111),
  buffer layer 1 of i-GaN with DC 1=1.1 μm;
  barrier layer 2 of Al GaN, with dC2=30 nm;
  intentionally doped area 3 with:
    Mg dopants at a concentration of $1.9 \times 10^{18}$ cm$^{-3}$, with La3=1 μm;
    Thickness dC3=400 nm; and
    Distance d=10 nm,
  gate G electrodes 1 μm wide, drain D and source S 2 μm wide.

These simulation results show that, in contrast to the conventional HEMT transistor, the threshold voltage of the HEMT transistor is positive because in particular of the adjustment of the distance d between the intentionally doped area 3 and the AlGaN/GaN interface. It is important to note that the modification of the distance d serves to control the threshold voltage of the transistor without modification of the thickness of the AlGaN layer and consequently without affecting the AlGaN/GaN interface current density.

However, with reference to FIG. 13, the leakage current shown schematically by IGS remains relatively high because of the presence of a Schottky contact between the gate G electrode and the barrier layer 2.

Figure 14:
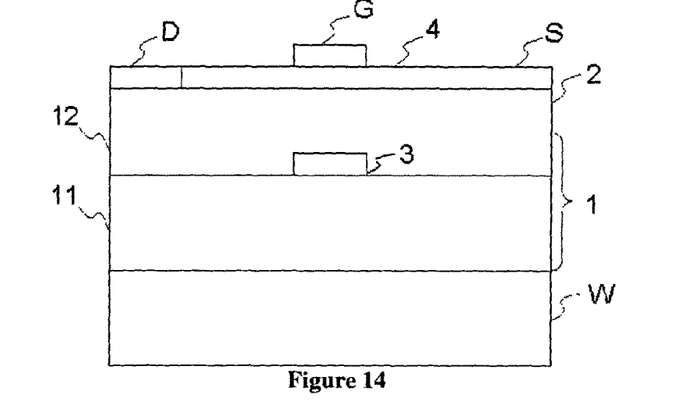
FIG. 14 is a section view of an example of a stack of an HEMT transistor according to another embodiment.

In order to remedy these disadvantages, another example of implementation integrates an oxide layer between the gate G electrode and the $Al_{(1-x)}GaN$ layer. As shown in FIG. 14, this additionally comprises:
  a plane substrate W,
  a buffer layer 1, arranged on the substrate W, of a large bandgap, Eg1, semiconductor material, based on a nitride from column III, where said buffer layer is not intentionally doped with n-type carriers;
  a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
  an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
  source S and drain D electrodes arranged on the barrier layer 2;
  a thermal oxide type electrically insulating layer 4; and
  a gate G electrode arranged on the electrically insulating layer 4.

The person skilled in the art will recognize that the techniques which can be used for depositing the insulating layer have been described above.

The presence of this electrically insulating layer 4 therefore serves to obtain a MOS (Metal Oxide Semiconductor) contact between the gate G contact and the barrier layer 2.

The oxide layer 4 can be obtained by thermal oxidation using, for example, a PECVD (Plasma Enhanced Chemical Vapor Deposition) type oxidation oven with which to obtain layers a few nanometers to a micron thick, for example. The presence of the oxide layer and the elimination of the Schottky contact serve to reduce the leakage current by the order of a factor of 20, for example, in that way serving to vary greatly improve the performance of the HEMT transistor.

The threshold voltage obtained as a function of the parameters cited above serves to obtain an HEMT transistor with a 4 V threshold voltage. This positive threshold voltage therefore serves to obtain, according to the various embodiments presented, an HEMT transistor which meets the normally-OFF functionality. New fields of application are possible because of such a component. In fact, this high threshold voltage serves to make this type of component insensitive to outside disruptions such as noise in the gate voltage, in particular electromagnetic noise.

Figure 15:
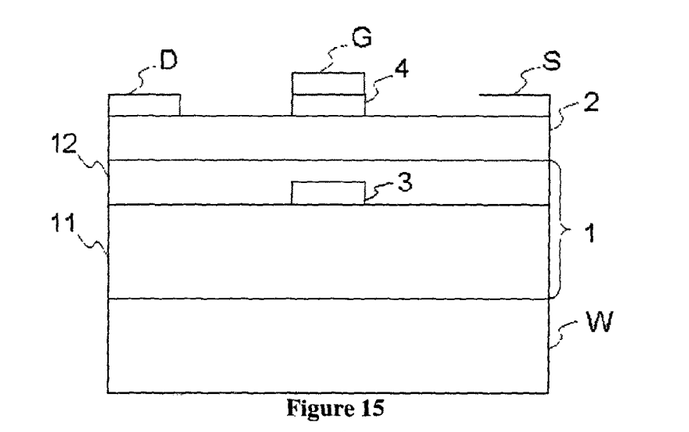
FIG. 15 is a section view of an example of a stack of an HEMT transistor according to another embodiment.

In another example of implementation of the invention, a structure is proposed additionally comprising as shown in FIG. 15:
  a plane substrate W;
  a buffer layer 1, arranged on the substrate W, of a large bandgap, Eg1, semiconductor material, based on a nitride from column III, where said buffer layer is not intentionally doped with n-type carriers;
  a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
  an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
  source S and drain D electrodes arranged on the barrier layer 2;
  a thermal oxide type electrically insulating layer 4, for example, with dimensions in the plane at least equal to the dimensions of the gate G electrode; and
  a gate G electrode arranged on the electrically insulating layer 4.

The person skilled in the art will recognize that the techniques which can be used for depositing the insulating layer and also for etching have been described above.

This embodiment additionally serves to reduce the parasitic capacitances appearing during switching at relatively high switching frequencies.

Figure 16:
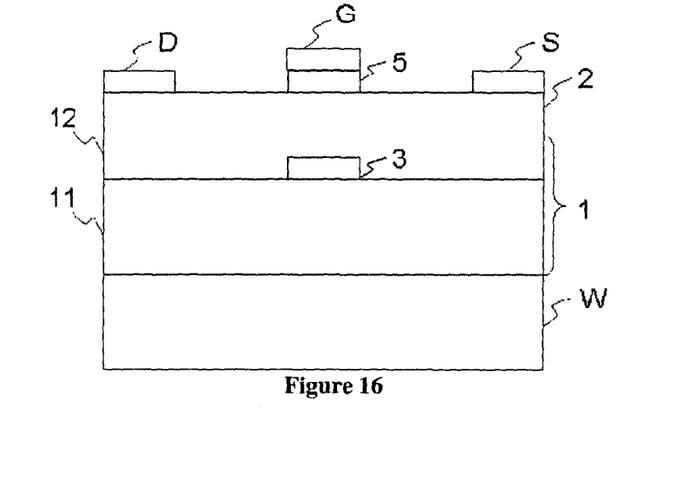
FIG. 16 is a section view of an example of a stack of an HEMT transistor according to another embodiment.

In another example of implementation of the invention, a structure is proposed additionally comprising as shown in FIG. 16:
- a plane substrate W;
- a buffer layer 1, arranged on the substrate W, of a large bandgap, Eg1, semiconductor material, based on a nitride from column III, where said buffer layer is not intentionally doped (i-GaN) with n-type carriers;
- a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
- an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
- source S and drain D electrodes arranged on the barrier layer 2;
- an intentionally doped layer 5 of the material based on a nitride from column III identical to the material of buffer layer 1 with dimensions in the plane at least equal to the dimensions of the gate G electrode.

This other embodiment of the invention additionally allows an even larger offset of the threshold voltage towards positive voltages. This embodiment in this way makes it possible to obtain HEMT transistors with higher positive threshold voltages.

Figure 17:
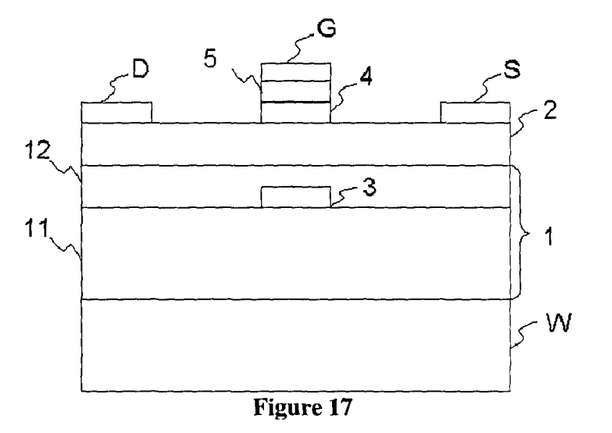
FIG. 17 is a section view of an example of a stack of an HEMT transistor according to another embodiment.

In another example of implementation of the invention with an objective of controlling the threshold voltage, a structure is proposed additionally comprising as shown in FIG. 17:
- a plane substrate W;
- a buffer layer 1, arranged on the substrate W, of a large bandgap, Eg1, semiconductor material, based on a nitride from column III, where said buffer layer is not intentionally doped with n-type carriers;
- a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer 1;
- an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
- source S and drain D electrodes arranged on the barrier layer 2;
- a thermal oxide type electrically insulating layer 4, for example, with dimensions in the plane at least equal to the dimensions of the gate G electrode deposited on the barrier layer 2;
- an intentionally doped layer 5 of the material based on a nitride from column III identical to the material of buffer layer 1 with dimensions in the plane at least equal to the dimensions of the gate G electrode; and
- a gate G electrode arranged in the layer a layer intentionally doped 5.

This other embodiment of the invention additionally serves to even more significantly offset the threshold voltage of the HEMT transistor according to the invention because of the presence of the electrically insulating layer 4. Finally in the last embodiment according to the invention serving to control the threshold voltage, a structure is proposed comprising (FIG. 18):
- a plane substrate W;
- a buffer layer 1, arranged on the substrate W, of a large bandgap, Eg1, semiconductor material, based on a nitride from column III (i-GaN), where said buffer layer is not intentionally doped with n-type carriers;
- a barrier layer 2 arranged above the buffer layer 1, of a large bandgap, Eg2, semiconductor material based on a nitride from column III, where said width of the bandgap, Eg2, of the barrier layer 2 is less than the width of the bandgap, Eg1, of the buffer layer;
- an intentionally doped area 3, of a material based on a nitride from column III identical to the material of the buffer layer 1, of a predefined length Lo3 and width La3 in a plane parallel to the plane of the substrate and a predefined thickness dC3 along a direction perpendicular to the plane of the substrate, where said intentionally doped area 3 is arranged in the buffer layer 1;
- source S and drain D electrodes arranged on the barrier layer 2;
- an intentionally doped layer 5 of a material based on a nitride from column III identical to the material from buffer layer 1 with dimensions in the plane at least equal to the dimensions of the gate G electrode and an electrically insulating layer 4 of thermal oxide type, for example, with dimensions in the plane at least equal to the dimensions of the gate G electrode; and
- a thermal oxide type electrically insulating layer 4, for example, with dimensions in the plane at least equal to the dimensions of the gate G electrode deposited on the intentionally doped layer 5; and
- a gate G electrode arranged on the electrically insulating layer 4.

Figure 18:
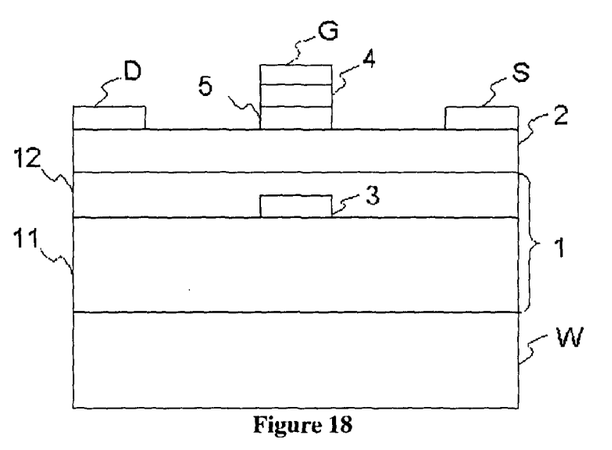
FIG. 18 is a section view of an example of a stack of an HEMT transistor according to a final embodiment.

This last embodiment in that way allows a control of the threshold voltage of the transistor according to the invention towards positive voltages.

The above description was given for illustration only and is not limiting on the scope of the invention. Any technically conceivable implementation variant can be preferred to the embodiments described. For example, the material, GaN, used in the description can be replaced by GaAs. The use of such material therefore means that the type of dopant and the levels which will be used and also the dimensions and positions of the intentionally doped area 3 will be chosen such that the overall behavior of the HEMT transistor using a GaAs material corresponds to the transistor described in the invention.

Similarly, the steps of the technological process described in the invention are given for illustration and are in no way limited to the examples given here. Finally, it is fully understood that the various improvements described can be used separately or in combination, according to the quality and performance sought for the HEMT transistor implemented with this structure.

The present invention is not limited to the implementation forms presented. Other variants and embodiments can be deduced and implemented by the person skilled in the art upon reading this description and the attached Figures. The reference signs cannot be understood as limiting the scope of the invention or the extent that the description.

In the above description, it is assumed that when one element like for example a layer, a region or substrate is mentioned as being "above" or "on" another element, said element can be directly on the other element or intermediate elements can be present.

It is also assumed that the terms first, $2^{nd}$, $3^{rd}$, etc. can be used here to describe various elements, components, regions, layers and/or sections. These elements, regions, layers and/or sections must not be limited by these terms. These terms are used solely to distinguish one element, component, region, layer or section from another region, layer or section. Thus, a first element, region, layer or section described above could be called $2^{nd}$ element, region, layer or section without moving away from the teaching of inventive concepts. Additionally, the terms for relative positioning, such as "under", "below", "lower", "above", "upper", etc. have been used here to facilitate the description and in order to describe the position of one element relative to another element as shown in the figures.

It will be understood that the terms for relative positioning are intended to cover different orientations of the device according to the invention during use or operation in addition to the orientation shown in the figures. For example, if the device according to the invention is turned over, the elements described as "below" or "under" other elements would then be oriented "above" other elements. Thus, the term "below" can encompass both an orientation "hereabove" and "herebelow". The device can also be oriented differently (rotation by 90° or other orientations) and the terms for relative positioning used here will be interpreted as a consequence.

The purpose of the terminology used in the description is only to describe the embodiments and is not intended to limit the inventive concepts. The singular articles "a", "an" and "the" can include plural articles unless the context clearly indicates otherwise. Furthermore it will be understood that the terms "include", "including", "includes" and "included in", when they are used in this description, indicate the presence of features, operations, elements and/or components but do not exclude the presence or addition of one or more other specificities, features, steps, operations, elements and components.

Additionally, examples of implementation have been described with reference to the illustrations which are schematic representations. Consequently, variations of the form from the illustrations because, for example, of manufacturing techniques and/or tolerances are to be expected. Therefore, the examples of implementation must not be interpreted as being limited to the specific shapes of the regions illustrated here, but must include variations in the resulting shapes. For example, an implanted region illustrated as a rectangle generally has a rounded or curved shape and the properties and/or concentration of dopants near the edges do too, instead of a binary change between the implanted and non-implanted region. Similarly, a buried region formed by implantation can lead to some implantation shape in the region located near the buried region and the surface by which the implantation was done. Thus, the region shown in the figures are schematic in nature and the shapes thereof are not intended to illustrate the actual shape of a region from a device and consequently are not intended to limit the scope of the inventive concepts.

Unless otherwise indicated, all the terms (including technical and scientific terms) used here have the same meaning as that currently understood by a person skilled in the art to which the inventive concepts belong. It will furthermore be understood that the term such as those defined in dictionaries commonly used must be interpreted as having a meaning which is compatible with their meaning in the context of the relevant art and will not be interpreted in an idealized or overly formal meaning unless expressly defined here.

The invention claimed is:

1. A heterojunction structure semiconductor material in particular for a high electron mobility transistor comprising:
   a planar substrate;
   a buffer layer, arranged on the substrate, of a first semiconductor material based on a nitride from column III and having a large first bandgap, where said buffer layer is not intentionally doped with n-type carriers;
   a barrier layer arranged above the buffer layer, of a second semiconductor material based on a nitride from column III and having a large second bandgap, where a width of the first bandgap of the buffer layer is less than a width of the second bandgap of the barrier layer;
   an intentionally doped area of a material based on a nitride from column III identical to the material of the buffer layer, with a predefined length and width in a plane parallel to a plane of the substrate and a predefined thickness along a direction perpendicular to the plane of the substrate, where said intentionally doped area is obtained by epitaxy, a doping element being introduced during growth by epitaxy, and where the intentionally doped area is comprised in the buffer layer.

2. The heterojunction structure according to claim 1, wherein the buffer layer, the barrier layer and the intentionally doped area are made from a material that includes GaN.

3. The heterojunction structure according to claim 1, wherein the intentionally doped area is placed under an interface between the buffer layer and the barrier layer.

4. The heterojunction structure according to claim 1, wherein at least one nucleation layer is interposed between the substrate and the buffer layer.

5. The heterojunction structure according to claim 1, wherein the intentionally doped area includes a p-type dopant.

6. The heterojunction structure according to claim 1, wherein the intentionally doped area is placed at a non-zero distance from an interface between the buffer layer and the barrier layer along the direction orthogonal to the plane of the substrate.

7. The heterojunction structure according to claim 6, wherein the distance between intentionally doped area and the interface between the buffer layer and the barrier layer is less than 800 nm.

8. A high electron mobility transistor comprising:
   a heterojunction structure according to claim 1; and
   a gate electrode, a drain electrode and a source electrode arranged on the barrier layer of the heterojunction structure.

9. The high electron mobility transistor according to claim 8, wherein the intentionally doped area includes a surface that is below or equal to a surface of the gate electrode.

10. A semiconductor electronic device comprising at least one high electron mobility transistor according to claim 8.

11. The high electron mobility transistor according to claim 8, additionally comprising an oxide-based insulating layer deposited on the barrier layer, above the gate electrode.

12. The high electron mobility transistor according to claim 11, wherein the insulating layer has a surface in a plane parallel to the plane of the substrate identical to a surface of the gate electrode in a plane parallel to the plane of the substrate.

* * * * *